US012489402B2

(12) United States Patent
Khlat et al.

(10) Patent No.: US 12,489,402 B2
(45) Date of Patent: Dec. 2, 2025

(54) VOLTAGE RIPPLE REDUCTION IN A POWER MANAGEMENT CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 402 days.

(21) Appl. No.: 18/296,033

(22) Filed: Apr. 5, 2023

(65) Prior Publication Data

US 2023/0387860 A1 Nov. 30, 2023

Related U.S. Application Data

(60) Provisional application No. 63/347,065, filed on May 31, 2022.

(51) Int. Cl.
*H03F 1/30* (2006.01)
*H03F 1/02* (2006.01)
*H03F 3/21* (2006.01)

(52) U.S. Cl.
CPC ............ *H03F 1/0233* (2013.01); *H03F 3/21* (2013.01); *H03F 2200/105* (2013.01); *H03F 2200/451* (2013.01)

(58) Field of Classification Search
CPC ........................................................ H03F 1/30
USPC ........................................................ 330/297
See application file for complete search history.

(56) References Cited

U.S. PATENT DOCUMENTS

| 4,797,898 | A | 1/1989 | Martinez |
| 5,793,821 | A | 8/1998 | Norrell et al. |
| 6,166,601 | A | 12/2000 | Shalom et al. |
| 6,275,685 | B1 | 8/2001 | Wessel et al. |

(Continued)

FOREIGN PATENT DOCUMENTS

| BR | 112015001348 A2 | 7/2017 |
| CN | 1151229 A | 6/1997 |

(Continued)

OTHER PUBLICATIONS

Advisory Action for U.S. Appl. No. 17/942,472, mailed Sep. 15, 2023, 3 pages.

(Continued)

*Primary Examiner* — Henry Choe
(74) *Attorney, Agent, or Firm* — Withrow & Terranova, P.L.L.C.

(57) ABSTRACT

Voltage ripple reduction in a power management circuit is disclosed. The power management circuit includes a power amplifier circuit configured to amplify a radio frequency (RF) signal based on a modulated voltage and an envelope tracking integrated circuit (ETIC) configured to provide the modulated voltage to the power amplifier circuit via a conductive path. Notably, an output impedance presenting at an input of the power amplifier circuit can interact with a modulated load current in the power amplifier circuit to create a voltage ripple in the modulated voltage to potentially cause an undesirable error in the RF signal. In this regard, a notch circuit is provided, preferably in the ETIC, to reduce the voltage ripple within a modulation bandwidth of the RF signal. As a result, it is possible to minimize the undesirable error, such as root-mean-square (RMS) error vector magnitude (EVM), within the modulation bandwidth of the RF signal.

20 Claims, 8 Drawing Sheets (56) References Cited

U.S. PATENT DOCUMENTS

| | | |
|---|---|---|
| 6,630,862 B1 | 10/2003 | Perthold et al. |
| 6,760,451 B1 | 7/2004 | Craven et al. |
| 6,806,767 B2 | 10/2004 | Dow |
| 6,947,711 B1 | 9/2005 | Leyonhjelm |
| 7,076,225 B2 | 7/2006 | Li et al. |
| 7,170,342 B2 | 1/2007 | Suzuki et al. |
| 7,430,248 B2 | 9/2008 | McCallister |
| 7,522,658 B2 | 4/2009 | Jensen |
| 7,583,754 B2 | 9/2009 | Liu |
| 7,663,436 B2 | 2/2010 | Takano et al. |
| 7,683,713 B2 | 3/2010 | Hongo |
| 7,738,593 B2 | 6/2010 | Howard |
| 7,755,429 B2 | 7/2010 | Nguyen et al. |
| 7,831,221 B2 | 11/2010 | Leffel et al. |
| 7,859,338 B2 | 12/2010 | Bajdechi et al. |
| 7,889,820 B2 | 2/2011 | Murthy et al. |
| 7,978,009 B2 | 7/2011 | Mu |
| 8,493,141 B2 | 7/2013 | Khlat et al. |
| 8,605,819 B2 | 12/2013 | Lozhkin |
| 8,649,745 B2 | 2/2014 | Bai et al. |
| 8,749,309 B2 | 6/2014 | Ho et al. |
| 8,831,544 B2 | 9/2014 | Walker et al. |
| 8,884,692 B2 | 11/2014 | Lee |
| 9,001,947 B2 | 4/2015 | Wyville |
| 9,036,734 B1 | 5/2015 | Mauer et al. |
| 9,065,504 B2 | 6/2015 | Kwon et al. |
| 9,112,413 B2 | 8/2015 | Barth et al. |
| 9,356,760 B2 | 5/2016 | Larsson et al. |
| 9,438,196 B2 | 9/2016 | Smith et al. |
| 9,461,596 B1 | 10/2016 | Ozard |
| 9,560,595 B2 | 1/2017 | Dakshinamurthy et al. |
| 9,692,366 B2 | 6/2017 | Pilgram |
| 9,705,477 B2 | 7/2017 | Velazquez |
| 9,973,370 B1 | 5/2018 | Langer et al. |
| 10,177,719 B2 | 1/2019 | Gazneli et al. |
| 10,181,478 B2 | 1/2019 | Scott et al. |
| 10,305,435 B1 | 5/2019 | Murugesu et al. |
| 10,326,408 B2 | 6/2019 | Khlat et al. |
| 10,361,744 B1 | 7/2019 | Khlat |
| 10,432,145 B2 | 10/2019 | Khlat |
| 10,476,437 B2 | 11/2019 | Nag et al. |
| 10,778,345 B2 | 9/2020 | El-Hassan et al. |
| 11,005,368 B2 | 5/2021 | Bansal et al. |
| 11,088,660 B2 | 8/2021 | Lin et al. |
| 11,387,789 B2 | 7/2022 | Khlat et al. |
| 11,424,719 B2 | 8/2022 | Khlat |
| 11,483,186 B2 | 10/2022 | Casper et al. |
| 11,569,783 B2 | 1/2023 | Nomiyama et al. |
| 11,637,531 B1 | 4/2023 | Perreault et al. |
| 2001/0022532 A1 | 9/2001 | Dolman |
| 2001/0054974 A1 | 12/2001 | Wright |
| 2002/0190811 A1 | 12/2002 | Sperber |
| 2003/0042979 A1 | 3/2003 | Gurvich et al. |
| 2004/0239446 A1 | 12/2004 | Gurvich et al. |
| 2004/0259509 A1 | 12/2004 | Duello et al. |
| 2005/0100105 A1 | 5/2005 | Jensen |
| 2005/0254659 A1 | 11/2005 | Heinsen |
| 2006/0068710 A1 | 3/2006 | Jensen |
| 2006/0209981 A1 | 9/2006 | Kluesing et al. |
| 2006/0217083 A1 | 9/2006 | Braithwaite |
| 2007/0032208 A1 | 2/2007 | Choi et al. |
| 2008/0009258 A1 | 1/2008 | Safarian et al. |
| 2008/0074209 A1 | 3/2008 | Ceylan et al. |
| 2008/0161073 A1 | 7/2008 | Park et al. |
| 2008/0246550 A1 | 10/2008 | Biedka et al. |
| 2009/0004981 A1 | 1/2009 | Eliezer et al. |
| 2009/0061787 A1 | 3/2009 | Koller et al. |
| 2009/0074106 A1 | 3/2009 | See et al. |
| 2009/0125264 A1 | 5/2009 | Betts et al. |
| 2009/0141828 A1 | 6/2009 | Huang et al. |
| 2009/0141830 A1 | 6/2009 | Ye |
| 2009/0232260 A1 | 9/2009 | Hayashi et al. |
| 2009/0302945 A1 | 12/2009 | Catoiu et al. |
| 2010/0135439 A1 | 6/2010 | Lackey |
| 2010/0298030 A1 | 11/2010 | Howard |
| 2011/0095826 A1 | 4/2011 | Hadjichristos et al. |
| 2011/0182347 A1 | 7/2011 | Cheung |
| 2011/0227767 A1 | 9/2011 | O'Brien |
| 2012/0068748 A1 | 3/2012 | Stojanovic et al. |
| 2012/0139635 A1 | 6/2012 | Ho et al. |
| 2012/0189081 A1 | 7/2012 | Omoto et al. |
| 2012/0244824 A1 | 9/2012 | Entezari et al. |
| 2012/0256688 A1 | 10/2012 | Onishi |
| 2013/0141062 A1 | 6/2013 | Khlat |
| 2013/0214858 A1 | 8/2013 | Tournatory et al. |
| 2013/0222057 A1 | 8/2013 | Henshaw |
| 2013/0243129 A1 | 9/2013 | Okuni et al. |
| 2014/0028368 A1 | 1/2014 | Khlat |
| 2014/0029683 A1 | 1/2014 | Morris et al. |
| 2014/0055199 A1 | 2/2014 | Takano et al. |
| 2014/0062590 A1 | 3/2014 | Khlat et al. |
| 2014/0062599 A1 | 3/2014 | Xu et al. |
| 2014/0065989 A1 | 3/2014 | McLaurin |
| 2014/0072307 A1 | 3/2014 | Zamani et al. |
| 2014/0084996 A1 | 3/2014 | Schwent et al. |
| 2014/0105264 A1 | 4/2014 | McLaurin et al. |
| 2014/0184337 A1 | 7/2014 | Nobbe et al. |
| 2014/0213196 A1 | 7/2014 | Langer et al. |
| 2014/0232470 A1 | 8/2014 | Wilson |
| 2014/0266432 A1 | 9/2014 | Scott et al. |
| 2014/0315504 A1 | 10/2014 | Sakai et al. |
| 2014/0361837 A1 | 12/2014 | Strange et al. |
| 2015/0028946 A1 | 1/2015 | Al-Qaq et al. |
| 2015/0126142 A1 | 5/2015 | Meredith |
| 2015/0333781 A1 | 11/2015 | Alon et al. |
| 2016/0173030 A1 | 6/2016 | Langer et al. |
| 2016/0174293 A1 | 6/2016 | Mow et al. |
| 2016/0182099 A1 | 6/2016 | Boddupally et al. |
| 2016/0182100 A1 | 6/2016 | Menkhoff et al. |
| 2016/0269210 A1 | 9/2016 | Kim et al. |
| 2016/0301432 A1 | 10/2016 | Shizawa et al. |
| 2016/0322992 A1 | 11/2016 | Okawa et al. |
| 2017/0005676 A1 | 1/2017 | Yan et al. |
| 2017/0104502 A1 | 4/2017 | Pratt |
| 2017/0149457 A1 | 5/2017 | Mayer et al. |
| 2017/0170838 A1 | 6/2017 | Pagnanelli |
| 2017/0230924 A1 | 8/2017 | Wolberg et al. |
| 2017/0338842 A1 | 11/2017 | Pratt |
| 2017/0353197 A1 | 12/2017 | Ruffieux et al. |
| 2018/0034418 A1 | 2/2018 | Blednov |
| 2018/0175813 A1 | 6/2018 | Scott et al. |
| 2018/0226923 A1 | 8/2018 | Nagamori |
| 2018/0248570 A1 | 8/2018 | Camuffo |
| 2019/0041890 A1 | 2/2019 | Chen et al. |
| 2019/0058530 A1 | 2/2019 | Rainish et al. |
| 2019/0068234 A1 | 2/2019 | Khlat et al. |
| 2019/0097671 A1 | 3/2019 | Dimpflmaier et al. |
| 2019/0238152 A1 | 8/2019 | Pagnanelli |
| 2019/0245496 A1 | 8/2019 | Khlat et al. |
| 2019/0296929 A1 | 9/2019 | Milicevic et al. |
| 2019/0319583 A1 | 10/2019 | El-Hassan et al. |
| 2019/0356285 A1 | 11/2019 | Khlat et al. |
| 2020/0106392 A1 | 4/2020 | Khlat et al. |
| 2020/0119699 A1 | 4/2020 | Nishihara et al. |
| 2020/0136561 A1 | 4/2020 | Khlat et al. |
| 2020/0136563 A1 | 4/2020 | Khlat |
| 2020/0136568 A1 | 4/2020 | Hosoda et al. |
| 2020/0162030 A1 | 5/2020 | Drogi et al. |
| 2020/0204422 A1 | 6/2020 | Khlat |
| 2020/0259685 A1 | 8/2020 | Khlat |
| 2020/0295713 A1 | 9/2020 | Khlat |
| 2020/0336111 A1 | 10/2020 | Khlat |
| 2021/0058970 A1 | 2/2021 | Kwak et al. |
| 2021/0067097 A1 | 3/2021 | Wang et al. |
| 2021/0099136 A1 | 4/2021 | Drogi et al. |
| 2021/0143859 A1 | 5/2021 | Hageraats et al. |
| 2021/0194517 A1 | 6/2021 | Mirea et al. |
| 2021/0194740 A1 | 6/2021 | Aldana et al. |
| 2021/0281228 A1 | 9/2021 | Khlat |
| 2021/0399690 A1 | 12/2021 | Panseri et al. |
| 2022/0021348 A1 | 1/2022 | Philpott et al. |
| 2022/0216834 A1 | 7/2022 | Myoung et al. |
| 2022/0360229 A1 | 11/2022 | Khlat |
| 2022/0407462 A1 | 12/2022 | Khlat |

(56) References Cited

U.S. PATENT DOCUMENTS

| | | |
|---|---|---|
| 2022/0407463 A1 | 12/2022 | Khlat et al. |
| 2022/0407464 A1 | 12/2022 | Khlat et al. |
| 2022/0407465 A1 | 12/2022 | Khlat |
| 2022/0407478 A1 | 12/2022 | Khlat et al. |
| 2022/0416730 A1 | 12/2022 | Su et al. |
| 2023/0065760 A1 | 3/2023 | Hellberg |
| 2023/0079153 A1 | 3/2023 | Khlat |
| 2023/0080621 A1 | 3/2023 | Khlat |
| 2023/0080652 A1 | 3/2023 | Khlat et al. |
| 2023/0081095 A1 | 3/2023 | Khlat |
| 2023/0082145 A1 | 3/2023 | Lin et al. |
| 2023/0140184 A1 | 5/2023 | Zhu et al. |
| 2023/0155614 A1 | 5/2023 | Jelonnek et al. |
| 2023/0238927 A1 | 7/2023 | Kay et al. |
| 2023/0318537 A1 | 10/2023 | Scott et al. |
| 2023/0387859 A1 | 11/2023 | Drogi et al. |
| 2023/0387861 A1 | 11/2023 | Maxim et al. |
| 2023/0421111 A1 | 12/2023 | Khlat et al. |
| 2024/0372665 A1 | 11/2024 | Khoryaev et al. |
| 2024/0426954 A1 | 12/2024 | Guan et al. |

FOREIGN PATENT DOCUMENTS

| | | |
|---|---|---|
| CN | 1326321 C | 12/2001 |
| CN | 1550064 A | 11/2004 |
| CN | 1706096 A | 12/2005 |
| CN | 101036289 A | 9/2007 |
| CN | 101651459 A | 2/2010 |
| CN | 105812073 A | 7/2016 |
| CN | 107483021 A | 12/2017 |
| CN | 110798155 A | 2/2020 |
| CN | 110855251 A | 2/2020 |
| CN | 111064438 A | 4/2020 |
| CN | 210693998 U | 6/2020 |
| CN | 112995079 A | 6/2021 |
| CN | 113055324 A | 6/2021 |
| CN | 113659938 A | 11/2021 |
| CN | 113055324 B | 12/2021 |
| CN | 116015223 A | 4/2023 |
| CN | 113659938 B | 5/2023 |
| CN | 116794580 A | 9/2023 |
| CN | 117134711 A | 11/2023 |
| CN | 118117977 A | 5/2024 |
| CN | 118648236 A | 9/2024 |
| CN | 118872201 A | 10/2024 |
| CN | 118117977 B | 11/2024 |
| CN | 119072847 A | 12/2024 |
| CN | 119096468 A | 12/2024 |
| EP | 2705604 A2 | 3/2014 |
| EP | 2582041 B1 | 4/2018 |
| EP | 2232713 B1 | 10/2018 |
| EP | 3416340 A1 | 12/2018 |
| JP | 2011211533 A | 10/2011 |
| JP | 2015099972 A | 5/2015 |
| KR | 20110105319 A | 9/2011 |
| WO | 2007092794 A2 | 8/2007 |
| WO | 2010011551 A2 | 1/2010 |
| WO | 2010135711 A1 | 11/2010 |
| WO | 2012151594 A2 | 11/2012 |
| WO | 2014026178 A1 | 2/2014 |
| WO | 2021042088 A2 | 3/2021 |
| WO | 2023147211 A1 | 8/2023 |
| WO | 2023150539 A1 | 8/2023 |
| WO | 2023150545 A1 | 8/2023 |
| WO | 2023150587 A1 | 8/2023 |

OTHER PUBLICATIONS

Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
Hammi et al., "Temperature Compensated Digital Predistorter for 3G Power Amplifiers," Electronics, Circuit and Systems, 2005, Dec. 11, 2005, pp. 1-4.
Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.
Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.
Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, p. 146145-146153.
Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.
Notice of Allowance for U.S. Appl. No. 17/689,232, mailed Oct. 21, 2024, 10 pages.
Notice of Allowance for U.S. Appl. No. 17/714,244, mailed Sep. 16, 2024, 8 pages.
Non-Final Office Action for U.S. Appl. No. 17/939,350, mailed Sep. 6, 2024, 8 pages.
Non-Final Office Action for U.S. Appl. No. 17/890,538, mailed Oct. 21, 2024, 13 pages.
Notice of Allowance and Examiner-Initiated Interview Summary for U.S. Appl. No. 17/700,826, mailed Sep. 11, 2024, 10 pages.
International Search Report and Written Opinion for International Patent Application No. PCT/US2023/060803, mailed May 19, 2023, 13 pages.
International Search Report and Written Opinion for International Patent Application No. PCT/US2023/060804, mailed May 4, 2023, 19 pages.
International Search Report and Written Opinion for International Patent Application No. PCT/US2023/025512, mailed Sep. 28, 2023, 13 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
Advisory Action U.S. Appl. No. 17/689,232, mailed May 23, 2024, 3 pages.
Non-Final Office Action for U.S. Appl. No. 17/689,232, mailed Jul. 17, 2024, 22 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.

(56) References Cited

OTHER PUBLICATIONS

International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Final Office Action for U.S. Appl. No. 17/942,472, mailed Jul. 19, 2023, 16 pages.
Fu, J.-S. et al., "Improving Power Amplifier Efficiency and Linearity Using a Dynamically Controlled Tunable Matching Network," IEEE Transactions on Microwave Theory and Techniques, vol. 56, No. 12, Dec. 2008, pp. 3239-3244.
Kim, S. et al., "A Tunable Power Amplifier Employing Digitally Controlled Accumulation-mode Varactor Array for 2.4-GHz Short-range Wireless Communication," 2016 IEEE Asia Pacific Conference on Circuits and Systems (APCCAS), Oct. 25-28, 2016, Jeju, Korea (South), IEEE, pp. 269-272.
Wang, T.-P., "A Fully Integrated W-Band Push-Push CMOS VCO With Low Phase Noise and Wide Tuning Range," IEEE Transactions on Ultrasonics, Ferroelectrics, and Frequency Control, vol. 58, No. 7, Jul. 2011, IEEE, pp. 1307-1319.
Wanner, R et al., "Monolithically Integrated SiGe Push-Push Oscillators in the Frequency Range 50-190 GHz," 2006 IEEE Ninth International Symposium on Spread Spectrum Techniques and Applications, Aug. 28-31, 2006, Manaus, Brazil, IEEE, pp. 26-30.
International Search Report and Written Opinion for International Patent Application No. PCT/US2022/043600, mailed Jan. 11, 2023, 15 pages.
Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
International Search Report and Written Opinion for International Patent Application No. PCT/US2023/060303, mailed Apr. 11, 2023, 12 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
Notice of Allowance for U.S. Appl. No. 17/700,685, mailed Apr. 5, 2024, 7 pages.
Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.

VOLTAGE RIPPLE REDUCTION IN A POWER MANAGEMENT CIRCUIT

RELATED APPLICATIONS

This application claims the benefit of U.S. provisional patent application Ser. No. 63/347,065, filed on May 31, 2022, the disclosure of which is hereby incorporated herein by reference in its entirety.

FIELD OF THE DISCLOSURE

The technology of the disclosure relates generally to reducing voltage ripple in a modulated voltage in a power management circuit.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standards for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 μs.

TABLE 1

| SCS (KHz) | CP (μs) | OFDM Symbol Duration (μs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols.

SUMMARY

Embodiments of the disclosure relate to voltage ripple reduction in a power management circuit. The power management circuit includes a power amplifier circuit configured to amplify a radio frequency (RF) signal based on a modulated voltage and an envelope tracking integrated circuit (ETIC) configured to provide the modulated voltage to the power amplifier circuit via a conductive path. Notably, an output impedance (e.g., an inductive impedance associated with the ETIC and the conductive path) presenting at an input of the power amplifier circuit can interact with a modulated load current in the power amplifier circuit to create a voltage ripple in the modulated voltage to potentially cause an undesirable error in the RF signal. In this regard, a notch circuit is provided, preferably in the ETIC, to reduce the voltage ripple within a modulation bandwidth of the RF signal. As a result, it is possible to minimize the undesirable error, such as a root-mean-square (RMS) error vector magnitude (EVM), within the modulation bandwidth of the RF signal.

In one aspect, a power management circuit is provided. The power management circuit includes a power amplifier circuit. The power amplifier circuit is configured to amplify an RF signal based on a modulated voltage received at a power amplifier input. The modulated voltage received at the power amplifier input comprises a voltage ripple caused by an output impedance presenting at the power amplifier input and a load current induced by the modulated voltage. The power management circuit also includes an ETIC. The ETIC is coupled to the power amplifier input via a conductive path. The ETIC includes a voltage modulation circuit. The voltage modulation circuit is configured to generate the modulated voltage at a voltage output based on a modulated target voltage. The ETIC also includes a notch circuit. The notch circuit is coupled to the power amplifier input via a notch path. The notch circuit is configured to resonate at a notch frequency within a modulation bandwidth of the RF signal to reduce the voltage ripple to thereby achieve a defined performance threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to voltage ripple reduction in a power management circuit. The power management circuit includes a power amplifier circuit configured to amplify a radio frequency (RF) signal based on a modulated voltage and an envelope tracking integrated circuit (ETIC) configured to provide the modulated voltage to the power amplifier circuit via a conductive path. Notably, an output impedance (e.g., an inductive impedance associated with the ETIC and the conductive path) presenting at an input of the power amplifier circuit can interact with a modulated load current in the power amplifier circuit to create a voltage ripple in the modulated voltage to potentially cause an undesirable error in the RF signal. In this regard, a notch circuit is provided, preferably in the ETIC, to reduce the voltage ripple within a modulation bandwidth of the RF signal. As a result, it is possible to minimize the undesirable error, such as a root-mean-square (RMS) error vector magnitude (EVM), within the modulation bandwidth of the RF signal.

Before discussing the specific voltage ripple reduction embodiment of the present disclosure, starting at FIG. 2, a brief overview of an existing transmission circuit is first discussed with reference to FIGS. 1A-1C to help understand some issues related to reducing voltage ripple based on conventional approaches.

Figure 1A:
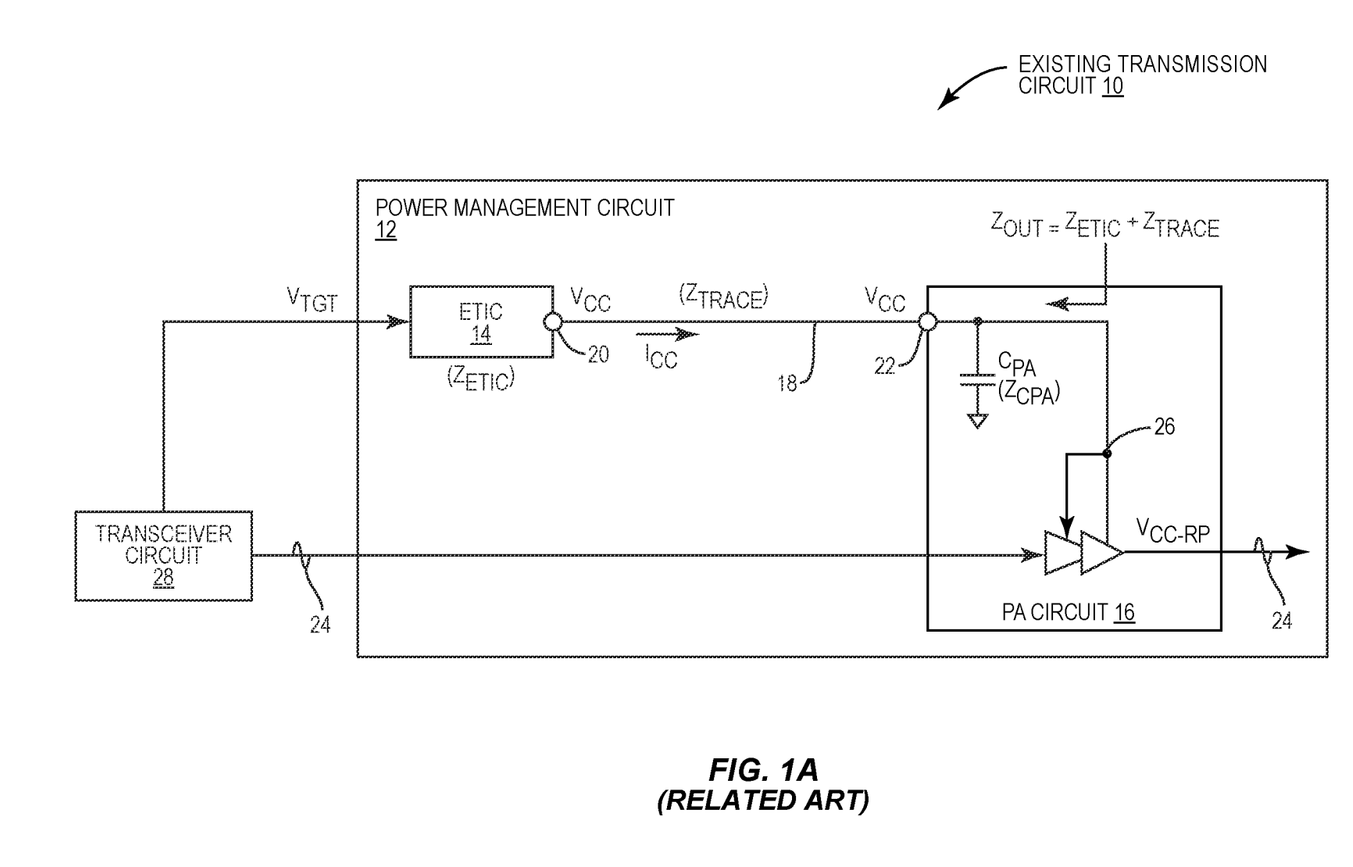
FIG. 1A is a schematic diagram of an exemplary existing transmission circuit wherein a power management circuit is configured to reduce a voltage ripple in a modulated voltage based on a conventional approach.
Figure 1B:
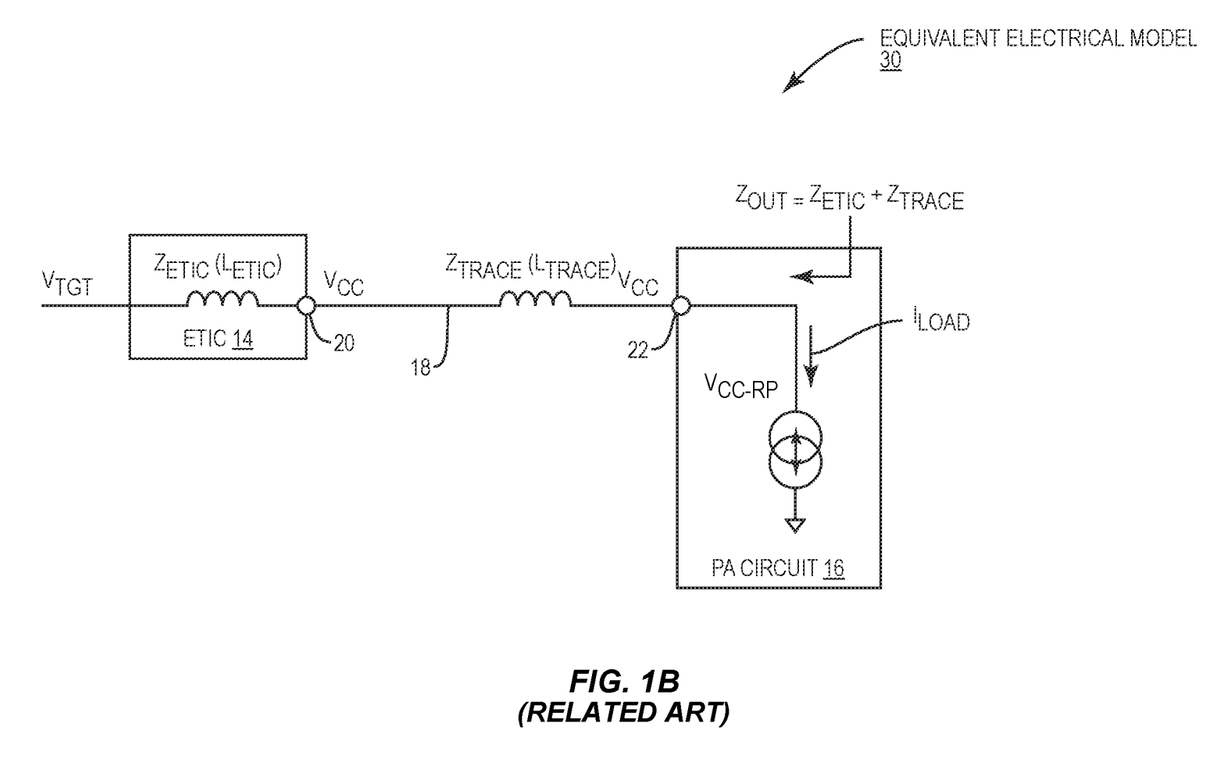
FIG. 1B is a schematic diagram of an exemplary electrical model of the power management circuit in FIG. 1A.
Figure 1C:
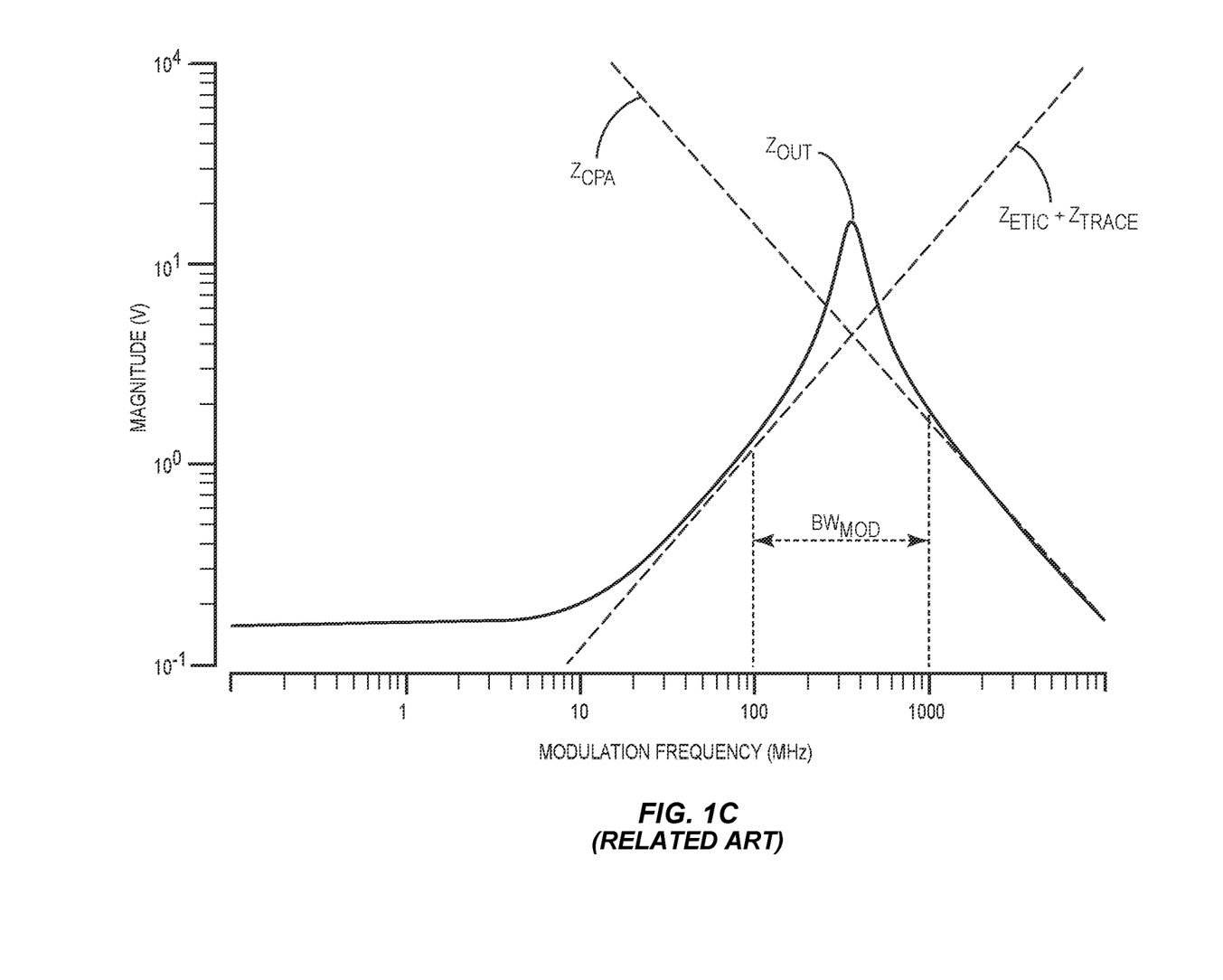
FIG. 1C is a graphic diagram providing an exemplary illustration of magnitude impedance as a function of modulation frequency.

FIG. 1A is a schematic diagram of an exemplary existing transmission circuit 10 wherein a power management circuit 12 is configured to reduce a voltage ripple $V_{CC\text{-}RP}$ in a modulated voltage $V_{CC}$ based on a conventional approach. The power management circuit 12 includes an ETIC 14 and a power amplifier circuit 16. The ETIC 14 is configured to generate the modulated voltage $V_{CC}$ based on a modulated target voltage $V_{TGT}$ and provide the modulated voltage $V_{CC}$ to the power amplifier circuit 16 via a conductive path 18 (e.g., a conductive trace), which is coupled between a voltage output 20 of the ETIC 14 and a power amplifier input 22 of the power amplifier circuit 16. The power amplifier circuit 16 is configured to amplify an RF signal 24 based on the modulated voltage $V_{CC}$.

Notably, there may be an internal routing distance from the power amplifier input 22 to an actual voltage input 26

(e.g., a collector node) of the power amplifier circuit. Given that the internal routing distance is far shorter than the conductive path 18, the internal routing distance is thus neglected hereinafter. Accordingly, the power amplifier input 22 as illustrated herein can be equated with the actual voltage input 26 of the power amplifier circuit 16.

The power management circuit 12 may be coupled to a transceiver circuit 28. Herein, the transceiver circuit 28 is configured to generate the RF signal 24 and the modulated target voltage $V_{TGT}$.

The voltage ripple $V_{CC-RP}$ can be quantitively analyzed based on an equivalent electrical model of the power management circuit 12. In this regard, FIG. 1B is a schematic diagram of an exemplary equivalent electrical model 30 of the power management circuit 12 in FIG. 1A. Common elements between FIGS. 1A and 1B are shown therein with common element numbers and will not be re-described herein.

The ETIC 14 inherently has an inductive impedance $Z_{ETIC}$ that can be modeled by an ETIC inductance $L_{ETIC}$. The conductive path 18 can also be associated with an inductive trace impedance $Z_{TRACE}$ that can be modeled by a trace inductance $L_{TRACE}$. As a result, looking from the power amplifier input 22 toward the ETIC 14, the power amplifier circuit 16 will see an output impedance $Z_{OUT}$ that includes both the inductive impedance $Z_{ETIC}$ and the inductive trace impedance $Z_{TRACE}$.

The power amplifier circuit 16 can be modeled as a current source. In this regard, the power amplifier circuit 16 will modulate a load current $I_{LOAD}$ based on the modulated voltage $V_{CC}$. The load current $I_{LOAD}$ can interact with the output impedance $Z_{OUT}$ to create the voltage ripple $V_{CC-RP}$ in the modulated voltage $V_{CC}$ received at the power amplifier input 22. In this regard, the voltage ripple $V_{CC-RP}$ is a function of the modulated load current $I_{LOAD}$ and the output impedance $Z_{OUT}$, as expressed in equation (Eq. 1) below.

$$V_{CC-RP}=I_{LOAD}*Z_{OUT} \qquad (Eq. 1)$$

Notably from the equation (Eq. 1), it may be possible to reduce the voltage ripple $V_{CC-RP}$ by lowering the output impedance $Z_{OUT}$ seen at the power amplifier input 22. In this regard, the conventional approach for reducing the voltage ripple $V_{CC-RP}$ in the power management circuit 12 of FIG. 1A is to add a decoupling capacitor $C_{PA}$ inside the power amplifier circuit 16 and be as close to the power amplifier input 22 as possible. By adding the decoupling capacitor $C_{PA}$, the output impedance $Z_{OUT}$ can be simply expressed as in equation (Eq. 2).

$$Z_{OUT}=Z_{CPA}||(Z_{ETIC}+Z_{TRACE}) \qquad (Eq. 2)$$

In the equation (Eq. 2), $Z_{CPA}$ represents a capacitive impedance of the decoupling capacitor $C_{PA}$. The capacitive impedance $Z_{CPA}$ and the inductive impedance $Z_{ETIC}$ and $Z_{TRACE}$ can each be determined according to equations (Eq. 3.1-3.3) below.

$$|Z_{CPA}|=1/2\pi f*C_{PA} \qquad (Eq. 3.1)$$

$$|Z_{ETIC}|=2\pi f*L_{ETIC} \qquad (Eq. 3.2)$$

$$|Z_{TRACE}|=2\pi f*L_{TRACE} \qquad (Eq. 3.3)$$

In the equations (Eq. 3.1-3.3), f represents the modulation frequency of the load current $I_{LOAD}$. In this regard, the capacitive impedance $Z_{CPA}$, the inductive impedance $Z_{ETIC}$, and the inductive trace impedance $Z_{TRACE}$ are each a function of the modulation frequency f. FIG. 1C is a graphic diagram providing an exemplary illustration of magnitude impedance vs. the modulation frequency f.

When the modulation frequency f is lower than 10 MHz, the output impedance $Z_{OUT}$ is dominated by a real part of the inductive impedance $Z_{ETIC}$ and a real part of the inductive trace impedance $Z_{TRACE}$. Between 10 MHz and 100 MHz, the output impedance $Z_{OUT}$ is dominated by the inductive impedance $Z_{ETIC}$ and the inductive trace impedance $Z_{TRACE}$. Above 1000 MHz, the output impedance $Z_{OUT}$ will be dominated by the capacitive impedance $Z_{CPA}$.

Herein, a modulation bandwidth $BW_{MOD}$ of the RF signal 24 may fall between 100 MHz and 1000 MHz (e.g., 100-500 MHz). In this frequency range, the output impedance $Z_{OUT}$ will be determined by the output impedance $Z_{OUT}$ as expressed in equation (Eq. 2).

Notably from equations (Eq. 2 and 3.1), the capacitive impedance $Z_{CPA}$, and therefore the output impedance $Z_{OUT}$, will decrease as the capacitance $C_{PA}$ increases. In this regard, the conventional approach for reducing the ripple voltage $V_{CC-RP}$ relies largely on adding the decoupling capacitor $C_{PA}$ with a larger capacitance (e.g., 1 to 2 µF). However, doing so can cause some obvious issues.

Understandably, a rate of change of the modulated voltage $V_{CC}$ (denoted as $\Delta V_{CC}$ or $dV_{CC}/dt$) can be inversely affected by the capacitance of the decoupling capacitor $C_{PA}$, as shown in equation (Eq. 4) below.

$$\Delta V_{CC}=I_{CC}/C_{PA} \qquad (Eq. 4)$$

In the equation (Eq. 4), $I_{CC}$ represents a low-frequency current (a.k.a. in-rush current) provided by the ETIC 14 when the decoupling capacitor $C_{PA}$ is charged or discharged. In this regard, the larger capacitance the decoupling capacitor $C_{PA}$ has, the larger amount of the low-frequency current $I_{CC}$ would be needed to change the modulated voltage $V_{CC}$ at a required rate of change ($\Delta V_{CC}$) of the modulated voltage $V_{CC}$. As a result, the existing transmission circuit 10 may cause a negative impact on battery life.

If the low-frequency current $I_{CC}$ is kept at a low level to prolong battery life, the existing transmission circuit 10 may have difficulty meeting the required rate of change ($\Delta V_{CC}$) of the modulated voltage $V_{CC}$, particularly when the RF signal 24 is modulated based on orthogonal frequency division multiplexing (OFDM) for transmission in a millimeter wave (mmWave) spectrum. Consequently, the existing transmission circuit 10 may not be able to change the modulated voltage $V_{CC}$ in between OFDM symbols.

On the other hand, if the capacitance of the decoupling capacitor $C_{PA}$ is reduced to help improve the rate of change ($\Delta V_{CC}$) of the modulated voltage $V_{CC}$ and reduce the in-rush current $I_{CC}$, doing so may lead to insufficient reduction of the output impedance $Z_{OUT}$ and, thus, the voltage ripple $V_{CC-RP}$. Hence, it is desirable to sufficiently reduce the ripple voltage $V_{CC-RP}$ within the modulation bandwidth $BW_{MOD}$ concurrent to improving the rate of change ($\Delta V_{CC}$) of the modulated voltage $V_{CC}$ and reducing the in-rush current $I_{CC}$.

Figure 2:
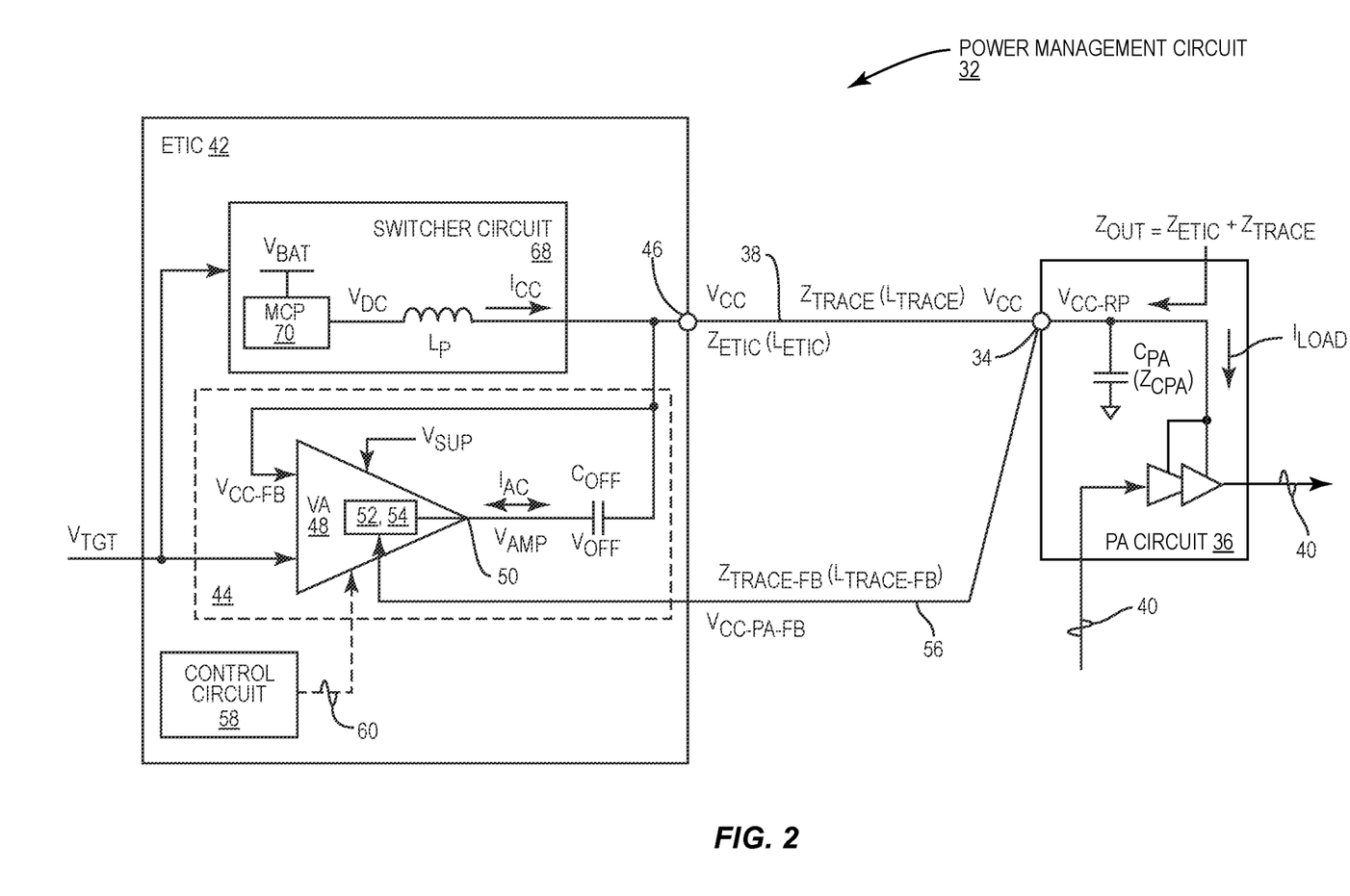
FIG. 2 is a schematic diagram of an exemplary power management circuit configured according to an embodiment of the present disclosure to reduce a voltage ripple in a modulated voltage by reducing an output impedance presenting at a power amplifier input of a power amplifier circuit.

FIG. 2 is a schematic diagram of an exemplary power management circuit 32 configured according to an embodiment of the present disclosure to reduce a voltage ripple $V_{CC-RP}$ in a modulated voltage $V_{CC}$ by reducing an output impedance $Z_{OUT}$ presenting at a power amplifier input 34 of a power amplifier circuit 36. Herein, the power amplifier circuit 36 is configured to receive the modulated voltage $V_{CC}$ via a conductive path 38 (e.g., a conductive trace) and amplify an RF signal 40 based on the modulated voltage $V_{CC}$. The power amplifier circuit 36 includes a decoupling capacitor $C_{PA}$. Similar to the decoupling capacitor $C_{PA}$ in the power amplifier circuit 16 in FIG. 1A, the decoupling capacitor $C_{PA}$ is also provided as close to the power amplifier input 34 as possible.

The power management circuit 32 includes an ETIC 42. The ETIC 42 includes a voltage modulation circuit 44. The voltage modulation circuit 44 is configured to generate the modulated voltage $V_{CC}$ at a voltage output 46 based on a modulated target voltage $V_{TGT}$. Herein, the voltage output 46 is coupled to the power amplifier input 34 via the conductive path 38.

Like the power management circuit 12 in FIG. 1A, the decoupling capacitor $C_{PA}$ has a capacitive impedance $Z_{CPA}$, the ETIC 42 inherently has an inductive impedance $Z_{ETIC}$, and the conductive path 38 is inherently associated with an inductive trace impedance $Z_{TRACE}$, which can be expressed as in the equations (Eq. 3.1-3.3). Accordingly, the power amplifier circuit 36 will see an output impedance $Z_{OUT}$, as determined in the equation (Eq. 2), within a modulation bandwidth (e.g., 100-500 MHz) of the RF signal 40. Herein, the power amplifier circuit 36 also operates as a current source, which can induce a modulated load current $I_{LOAD}$ based on the modulated voltage $V_{CC}$. Similar to the power management circuit 12 in FIG. 1A, the modulated load current $I_{LOAD}$ can interact with the output impedance $Z_{OUT}$ to create the voltage ripple $V_{CC-RP}$ in the modulated voltage $V_{CC}$ received at the power amplifier input 34.

In embodiments disclosed herein, the decoupling capacitor $C_{PA}$ has a smaller capacitance (e.g., 100 pF) compared to the decoupling capacitor $C_{PA}$ in the power amplifier circuit 16 in FIG. 1A. By employing the smaller decoupling capacitor $C_{PA}$, it is possible to improve the rate of change ($\Delta V_{CC}$) of the modulated voltage $V_{CC}$ to satisfy the stringing voltage switching time requirement (e.g., per OFDM symbol or sub-symbol) in such advanced wireless systems as fifth generation (5G) and 5G new-radio (5G-NR), while concurrently reducing the in-rush current $I_{CC}$ to prolong battery life.

Further, the power management circuit 32 is configured to reduce the voltage ripple $V_{CC-RP}$ in the modulated voltage $V_{CC}$ by reducing the output impedance $Z_{OUT}$ presenting at the power amplifier input 34 and/or creating a notch filter at the power amplifier input 34. As a result, the power management circuit 32 can achieve a defined performance threshold, such as RMS EVM and/or peak EVM within the modulation bandwidth of the RF signal 40.

In an embodiment, the voltage modulation circuit 44 includes a voltage amplifier 48 (denoted as "VA"), which can be an operational amplifier (OpAmp), as an example. The voltage amplifier 48 is configured to generate an initial modulated voltage $V_{AMP}$ at a voltage amplifier output 50 based on the modulated target voltage $V_{TGT}$ and a supply voltage $V_{SUP}$. The voltage modulation circuit 44 also includes an offset capacitor $C_{OFF}$ that is coupled in between the voltage amplifier output 50 and the voltage output 46. The offset capacitor $C_{OFF}$ is configured to raise the initial modulated voltage $V_{AMP}$ by an offset voltage $V_{OFF}$ to thereby generate the modulated voltage $V_{CC}$ at the voltage output 46 ($V_{CC}=V_{AMP}+V_{OFF}$).

The voltage amplifier 48 is also configured to receive a modulated voltage feedback $V_{CC-FB}$ that indicates the modulated voltage $V_{CC}$ at the voltage output 46, thus making the voltage modulation circuit 44 a closed-loop circuit. Accordingly, the voltage amplifier 48 can adjust the initial modulated voltage $V_{AMP}$ and, thus the modulated voltage $V_{CC}$, based on the modulated feedback $V_{CC-FB}$ to better track the modulated target voltage $V_{TGT}$.

The voltage amplifier 48 includes an input/bias stage 52 and an output stage 54. The output stage 54 is coupled in series to the voltage amplifier output 50. According to an embodiment of the present disclosure, the output stage 54 is configured to receive a power amplifier voltage feedback $V_{CC-PA-FB}$ that indicates the modulated voltage $V_{CC}$ as received at the power amplifier input 34. In an embodiment, the output stage 54 may receive the power amplifier voltage feedback $V_{CC-PA-FB}$ via a feedback path 56. Like the conductive path 38, the feedback path 56 is associated with an inductive feedback trace impedance $Z_{TRACE-FB}$ that can be modeled by a feedback inductance $L_{TRACE-FB}$.

Understandably, since the power amplifier voltage feedback $V_{CC-PA-FB}$ is provided from the power amplifier input 34, the power amplifier voltage feedback $V_{CC-PA-FB}$ will include the voltage ripple $V_{CC-RP}$ in the modulated voltage $V_{CC}$ as received at the power amplifier input 34. Accordingly, the voltage amplifier 48 may modify the initial modulated voltage $V_{AMP}$ based on the power amplifier voltage feedback $V_{CC-PA-FB}$ to cause the output impedance $Z_{OUT}$ to be reduced at the power amplifier input 34, thus helping to reduce the voltage ripple $V_{CC-RP}$ in the modulated voltage $V_{CC}$ that is received at the power amplifier input 34.

The ETIC 42 may include a control circuit 58, which can be a field-programmable gate array (FPGA) or an application-specific integrated circuit (ASIC), as an example. In an embodiment, the control circuit 58 may control the voltage amplifier 48, for example, via a control signal 60, to modify the initial modulated voltage $V_{AMP}$ based on the power amplifier voltage feedback $V_{CC-PA-FB}$ to thereby reduce the output impedance $Z_{OUT}$ at the power amplifier input 34.

Figure 3:
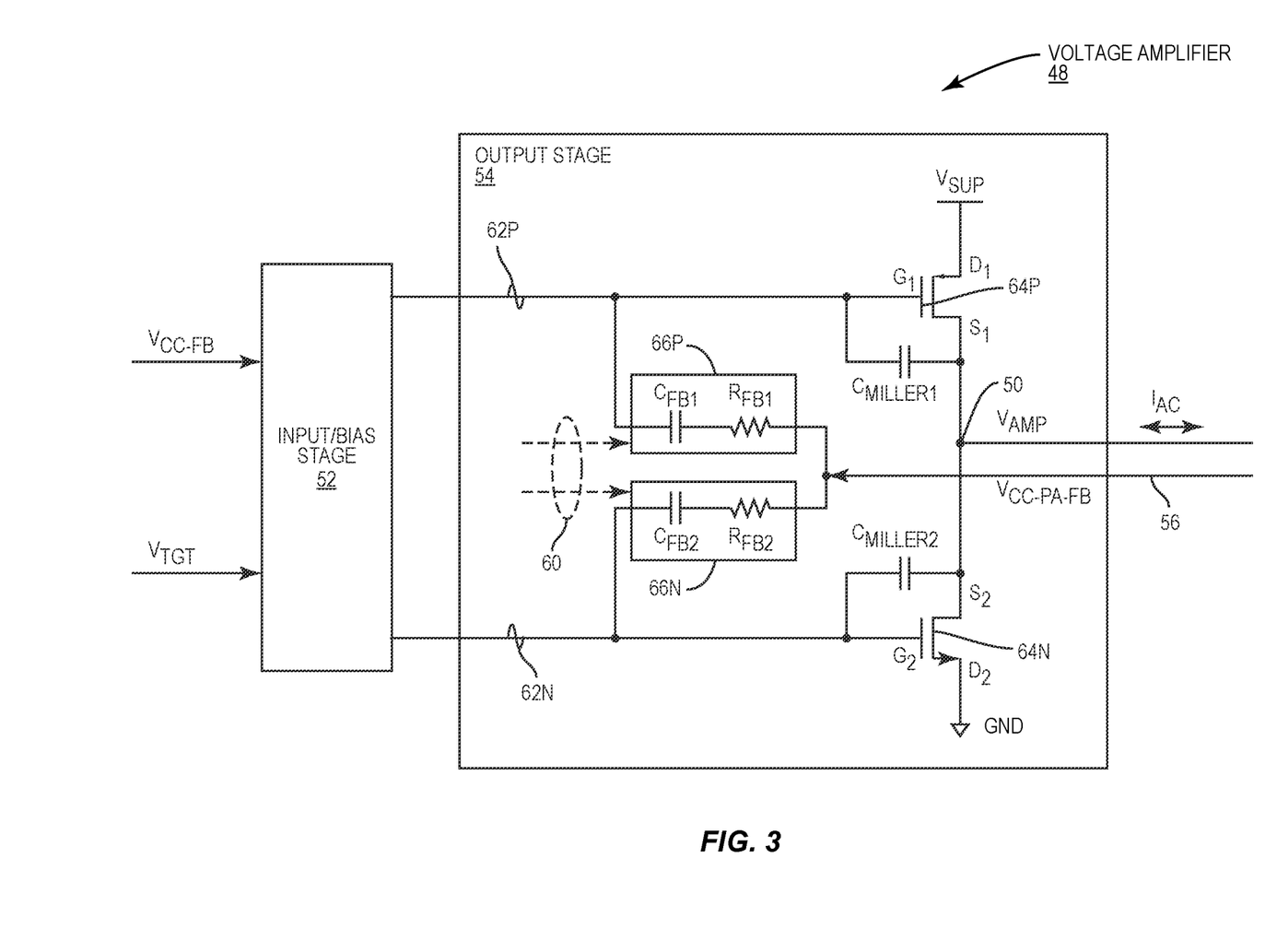
FIG. 3 is a schematic diagram providing an exemplary illustration of an inner structure of a voltage amplifier in the power management circuit of FIG. 2.

FIG. 3 is a schematic diagram providing an exemplary illustration of an inner structure of the voltage amplifier 48 in FIG. 2. Common elements between FIGS. 2 and 3 are shown therein with common element numbers and will not be re-described herein.

In an embodiment, the input/bias stage 52 is configured to receive the modulated target voltage $V_{TGT}$ and the modulated voltage feedback $V_{CC-FB}$. Accordingly, the input/bias stage 52 generates a pair of bias signals 62P, 62N to control the output stage 54.

In an embodiment, the output stage 54 is configured to generate the initial modulated voltage $V_{AMP}$ at the voltage amplifier output 50 based on a selected one of the bias signals 62P, 62N. The output stage 54 is also configured to receive the power amplifier voltage feedback $V_{CC-PA-FB}$. Accordingly, the output stage 54 can modify the initial modulated voltage $V_{AMP}$ based on the power amplifier voltage feedback $V_{CC-PA-FB}$ to reduce the output impedance $Z_{OUT}$ and thereby the voltage ripple $V_{CC-RP}$ at the power amplifier input 34.

In an embodiment, the output stage 54 includes a first transistor 64P and a second transistor 64N. In a non-limiting example, the first transistor 64P is a p-type field-effect transistor (pFET) and the second transistor 64N is an n-type FET (nFET). In this example, the first transistor 64P includes a first source electrode $S_1$, a first drain electrode $D_1$, and a first gate electrode $G_1$, and the second transistor 64N includes a second source electrode $S_2$, a second drain electrode $D_2$, and a second gate electrode $G_2$. Specifically, the first drain electrode $D_1$ is configured to receive the supply voltage $V_{SUP}$, the second drain electrode D2 is coupled to a ground (GND), and the first source electrode $S_1$ and the second source electrode $S_2$ are both coupled to the voltage amplifier output 50.

The first gate electrode $G_1$ is coupled to the input/bias stage 52 to receive the bias signal 62P and the second gate electrode $G_2$ is coupled to the input/bias stage 52 to receive the bias signal 62N. Herein, the input/bias stage 52 is configured to generate the bias signal 62P in response to an increase of the modulated voltage $V_{CC}$ or generate the bias signal 62N in response to a decrease of the modulated voltage $V_{CC}$. Specifically, the first transistor 64P will be turned on to output the initial modulated voltage $V_{AMP}$ and source a high-frequency current $I_{AC}$ (e.g., an alternating current) from the supply voltage $V_{SUP}$ in response to receiving the bias signal 62P, and the second transistor 64N will be turned on to output the initial modulated voltage $V_{AMP}$ from the supply voltage $V_{SUP}$ and sink the high-frequency current $I_{AC}$ to the GND in response to receiving the bias signal 62N.

In this embodiment, the output stage 54 also includes a first Miller capacitor $C_{Miller1}$ and a second Miller capacitor $C_{Miller2}$. Specifically, the first Miller capacitor $C_{Miller1}$ is coupled between the voltage amplifier output 50 and the first gate electrode $G_1$, and the second Miller capacitor $C_{Miller2}$ is coupled between the voltage amplifier output 50 and the second gate electrode $G_2$. In this regard, the output stage 54 can be regarded as a typical class AB rail-rail OpAmp output stage. The first Miller capacitor $C_{Miller1}$ and the second Miller capacitor $C_{Miller2}$ not only can stabilize controls of the first transistor 64P and the second transistor 64N (e.g., mitigating so-called Miller effect), but may also reduce the closed-loop output impedance of the voltage amplifier 48.

Notably, since the first Miller capacitor $C_{Miller1}$ and the second Miller capacitor $C_{Miller2}$ are each coupled to the voltage amplifier output 50, the first Miller capacitor $C_{Miller1}$ and the second Miller capacitor $C_{Miller2}$ can only reduce the inductive impedance $Z_{ETIC}$, which is part of the output impedance $Z_{OUT}$ seen at the power amplifier input 34. As such, to further reduce the output impedance $Z_{OUT}$, it is also necessary to reduce the inductive trace impedance $Z_{TRACE}$.

In this regard, the output stage 54 further includes a first resistor-capacitor (RC) circuit 66P and a second RC circuit 66N. The first RC circuit 66P and the second RC circuit 66N are both coupled to the power amplifier input 34 via the feedback path 56 to thereby receive the power amplifier voltage feedback $V_{CC-PA-FB}$. Specifically, the first RC circuit 66P is coupled between the power amplifier input 34 and the first gate electrode $G_1$, and the second RC circuit 66N is coupled between the power amplifier input 34 and the second gate electrode $G_2$. As such, the first RC circuit 66P can cause the power amplifier voltage feedback $V_{CC-PA-FB}$ to be combined with the bias signal 62P to thereby modify the bias signal 62P. Similarly, the second RC circuit 66N can cause the power amplifier voltage feedback $V_{CC-PA-FB}$ to be combined with the bias signal 62N to thereby modify the bias signal 62N.

In an embodiment, the first RC circuit 66P includes a first adjustable resistor $R_{FB1}$ and a first adjustable capacitor $C_{FB1}$, and the second RC circuit 66N includes a second adjustable resistor $R_{FB2}$ and a second adjustable capacitor $C_{FB2}$. Recall that the feedback path 56 is associated with the inductive feedback trace impedance $Z_{TRACE-FB}$ that can be modeled by the feedback inductance $L_{TRACE-FB}$. As such, the first adjustable resistor $R_{FB1}$, the first adjustable capacitor $C_{FB1}$, and the feedback inductance $L_{TRACE-FB}$ can be equated with a first resistor-inductor-capacitor (RLC) circuit, which has a first resonance frequency $f_1$ as expressed in equation (Eq. 5) below.

$$f_1 = 1/2\pi\sqrt{L_{TRACE-FB} * C_{FB1}} \tag{Eq. 5}$$

Likewise, the second adjustable resistor $R_{FB2}$, the second adjustable capacitor $C_{FB2}$, and the feedback inductance $L_{TRACE-FB}$ can be equated with a second RLC circuit, which has a second resonance frequency $f_2$ as expressed in equation (Eq. 6) below.

$$f_2 = 1/2\pi\sqrt{L_{TRACE-FB} * C_{FB2}} \tag{Eq. 6}$$

From equations (Eq. 5 and 6), the first adjustable capacitor $C_{FB1}$ and the second adjustable capacitor $C_{FB2}$ can each be adjusted to resonate with the feedback inductance $L_{TRACE-FB}$ to create a low-impedance feedback path at a respective one of the first resonance frequency $f_1$ and the second resonance frequency $f_2$. The first adjustable resistor $R_{FB1}$ will de-Q (i.e., decrease Q-factor) the first resonance frequency $f_1$ across the modulation bandwidth $BW_{MOD}$ to prevent the first adjustable capacitor $C_{FB1}$ and the feedback inductance $L_{TRACE-FB}$ from entering oscillation at the first resonance frequency $f_1$. Likewise, the second adjustable resistor $R_{FB2}$ will de-Q (i.e., decrease Q-factor) the second resonance frequency $f_2$ across the modulation bandwidth $BW_{MOD}$ to prevent the second adjustable capacitor $C_{FB2}$ and the feedback inductance $L_{TRACE-FB}$ from entering oscillation at the second resonance frequency $f_2$.

When the voltage ripple $V_{CC-RP}$ seen at the power amplifier input 34 is fed back to the first gate electrode $G_1$ or the second gate electrode $G_2$, the first transistor 64P and the second transistor 64N may act like a common source amplifier, which amplifies and inverts the initial modulated voltage $V_{AMP}$ at the voltage amplifier output 50 and, therefore, the voltage output 46 of the ETIC 42. The inverted initial modulated voltage $V_{AMP}$ will cause more of the load current $I_{LOAD}$ to flow to the GND through the conductive path 38 (a.k.a. the trace inductor $L_{TRACE}$) than flowing through the power amplifier circuit 36, thus lowering the inductive trace impedance $Z_{TRACE}$ and, accordingly the output impedance $Z_{OUT}$ at the power amplifier input 34.

Thus, by adjusting the first adjustable capacitor $C_{FB1}$, the first adjustable resistor $R_{FB1}$, the second adjustable capacitor $C_{FB2}$, and/or the second adjustable resistor $R_{FB2}$, it is possible to reduce the output impedance $Z_{OUT}$ across the modulation bandwidth $BW_{MOD}$. In an embodiment, the first adjustable capacitor $C_{FB1}$, the first adjustable resistor $R_{FB1}$, the second adjustable capacitor $C_{FB2}$, and/or the second adjustable resistor $R_{FB2}$ may be adjusted by the control circuit 58 via the control signal 60.

By employing the first Miller capacitor $C_{Miller1}$ and the second Miller capacitor $C_{Miller2}$ to help reduce the inductive impedance $Z_{ETIC}$, and further employing the first RC circuit 66P and the second RC circuit 66N to help reduce the inductive trace impedance $Z_{TRACE}$, it is possible to reduce the output impedance $Z_{OUT}$ to thereby reduce the voltage ripple $V_{CC-RP}$ in the modulated voltage $V_{CC}$. A simulation shows that, at 200 MHz load current modulation frequency, the power management circuit 32 can reduce an RMS value of the voltage ripple $V_{CC-RP}$ from 231 mV, as in the power management circuit 12 in FIG. 1A, to 134 mV, which amounts to a 42% improvement.

With reference back to FIG. 2, the ETIC 42 further includes a switcher circuit 68. In an embodiment, the switcher circuit 68 includes a multi-level charge pump (MCP) 70 that is coupled to the voltage output 46 via a power inductor $L_P$. The MCP 70, which can be a buck-boost voltage converter, as an example, is configured to generate a low-frequency voltage $V_{DC}$ based on a battery voltage $V_{BAT}$. Specifically, the MCP 70 may operate in a buck mode to generate the low-frequency voltage $V_{DC}$ at $0 \times V_{BAT}$ or $1 \times V_{BAT}$, or in a boost mode to generate the low-frequency voltage $V_{DC}$ at $2 \times V_{BAT}$. Thus, by configuring the MCP 70 to toggle between $0 \times V_{BAT}$, $1 \times V_{BAT}$, and/or $2 \times V_{BAT}$ based on an appropriate duty cycle, the MCP 70 can generate the low-frequency voltage $V_{DC}$ at multiple voltage levels.

The power inductor $L_P$ is configured to induce a low-frequency current $I_{CC}$ (a.k.a. in-rush current) based on the low-frequency voltage $V_{DC}$. As previously described in FIG. 1A, the low-frequency current $I_{CC}$ is provided to the power amplifier input 34 to charge the decoupling capacitor $C_{PA}$.

Figure 4:
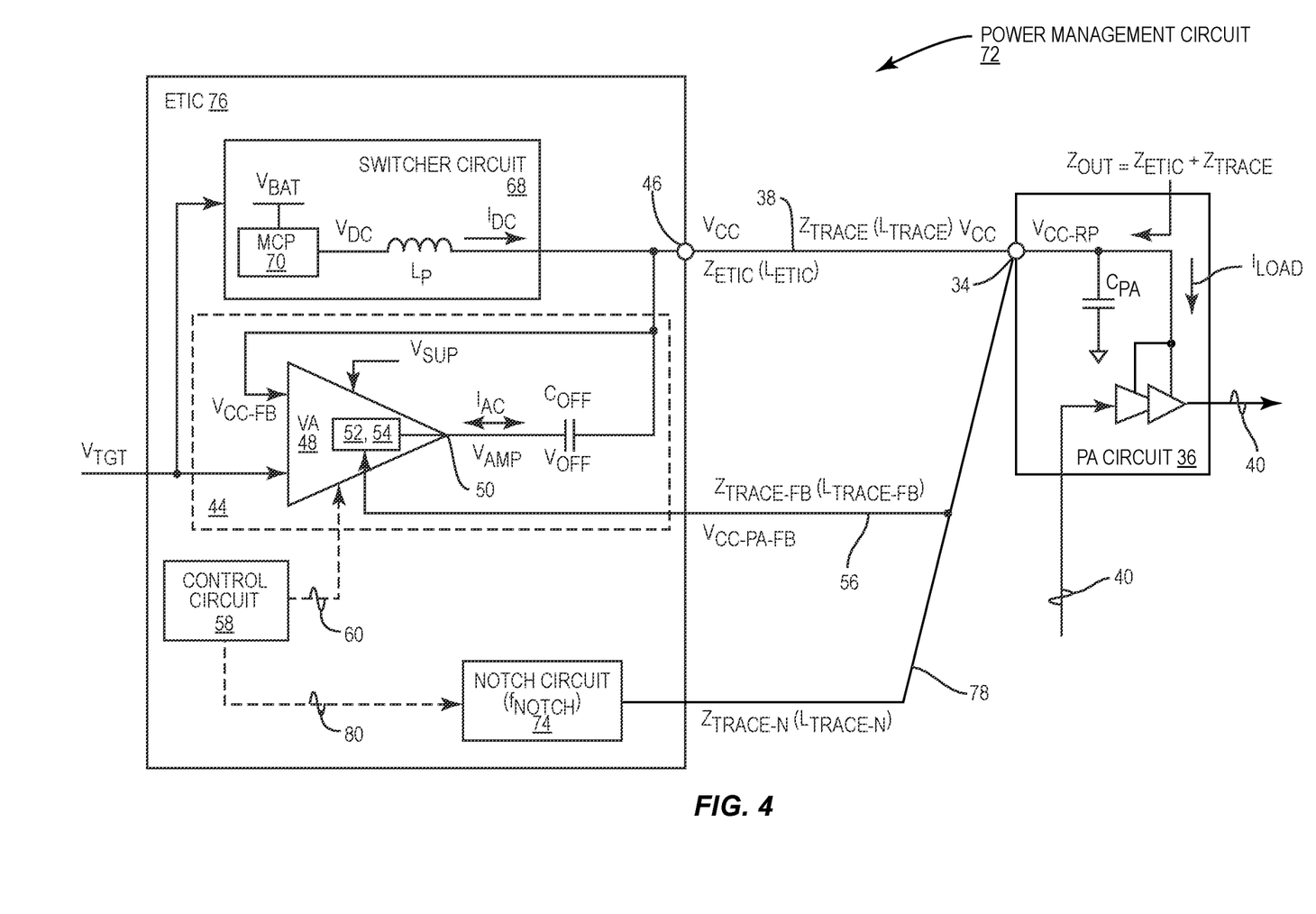
FIG. 4 is a schematic diagram of an exemplary power management circuit, wherein a notch circuit can be added to the power management circuit of FIG. 2 to further reduce the voltage ripple in the modulation voltage.

In addition to reducing the output impedance $Z_{OUT}$ to help reduce the voltage ripple $V_{CC-RP}$, it is possible to further reduce the voltage ripple $V_{CC-RP}$ at a specific load current modulation frequency within the modulation bandwidth of the RF signal 40 using a notch filter. In this regard, FIG. 4 is a schematic diagram of an exemplary power management circuit 72, wherein a notch circuit 74 can be added to the power management circuit 32 of FIG. 2 to further reduce the voltage ripple $V_{CC-RP}$ in the modulation voltage $V_{CC}$. Common elements between FIGS. 2 and 4 are shown therein with common element numbers and will not be re-described herein.

The power management circuit 72 includes an ETIC 76, wherein the notch circuit 74 is provided. It should be appreciated that it is also possible for the notch circuit 74 to be integrated into the power amplifier circuit 36. Herein, the notch circuit 74 is coupled to the power amplifier input 34 via a notch path 78. Like the conductive path 38 and the feedback path 56, the notch path 78 is also associated with an inductive notch trace impedance $Z_{TRACE-N}$ that can be modeled by a notch inductance $L_{TRACE-N}$. In an embodiment, the notch circuit 74 may be controlled by the control circuit 58, for example via a second control signal 80, to resonate at a notch frequency $f_{NOTCH}$ within the modulation bandwidth $BW_{MOD}$ to reduce the voltage ripple $V_{CC-RP}$ in the modulated voltage $V_{CC}$. In an embodiment, the notch frequency $f_{NOTCH}$ may be determined by factoring in the notch inductance $L_{TRACE-N}$ associated with the notch path 78. As a result, the power management circuit 72 can achieve a defined performance threshold (e.g., RMS EVM or peak EVM). A simulation shows that, by adding the notch circuit 74 into the power management circuit 32 of FIG. 2, the RMS value of the voltage ripple $V_{CC-RP}$ can be further reduced from 134 mV to 87 mV for the 200 MHz load current modulation frequency.

Figure 5:
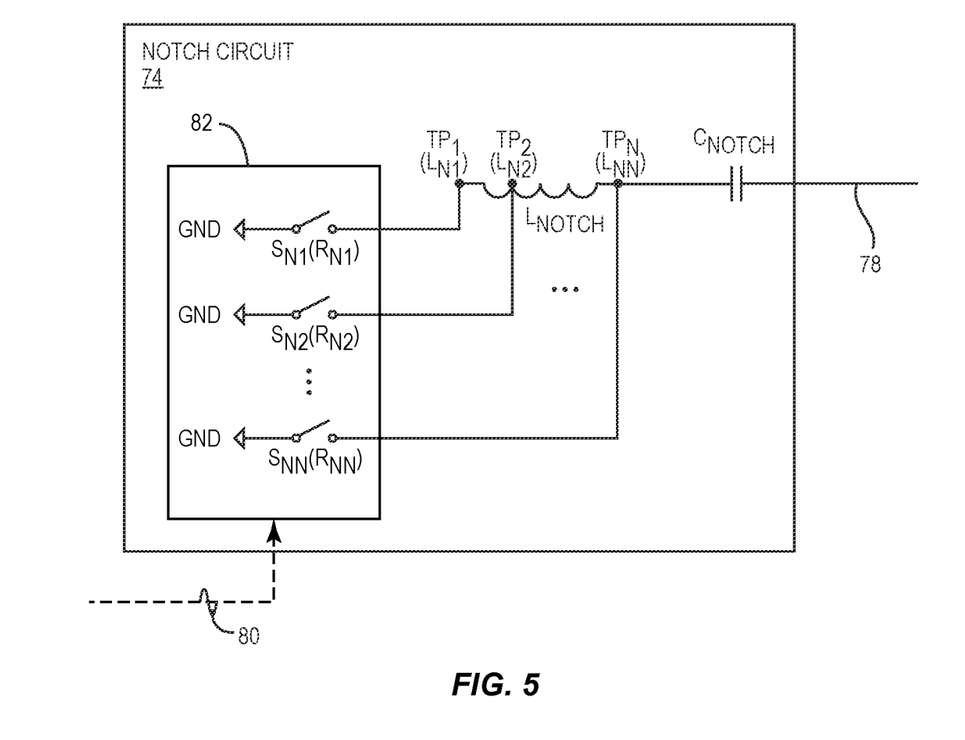
FIG. 5 is a schematic diagram illustrating an exemplary configuration of the notch circuit in FIG. 4.

FIG. 5 is a schematic diagram illustrating an exemplary configuration of the notch circuit 74 in the power management circuit 72 of FIG. 4. Common elements between FIGS. 4 and 5 are shown therein with common element numbers and will not be re-described herein.

Herein, the notch circuit 74 includes a notch capacitor $C_{NOTCH}$, a notch inductor $L_{NOTCH}$, and a switch circuit 82. The switch circuit 82 includes multiple switches $S_{N1}$-$S_{NN}$, each having a respective one of multiple notch resistances $R_{N1}$-$R_{NN}$. Notably, the notch resistances $R_{N1}$-$R_{NN}$ can be identical to or different from one another. The notch inductor $L_{NOTCH}$ includes multiple tap points $TP_1$-$TP_N$, each corresponding to a respective one of multiple notch inductances $L_{N1}$-$L_{NN}$. Herein, each of the notch switches $S_{N1}$-$S_{NN}$ is coupled between a respective one of the tap points $TP_1$-$TP_N$ and the GND. Thus, by selectively closing any one of the notch switches $S_{N1}$-$S_{NN}$, it is possible to change the overall resistance and inductance of the notch circuit 74 and, therefore, change the notch frequency $f_{NOTCH}$ of the notch circuit 74.

In an embodiment, the control circuit 58 may control the switch circuit 82 via the second control signal 80 to selectively close any of the notch switches $S_{N1}$-$S_{NN}$. In a non-limiting example, the notch resistances $R_{N1}$-$R_{NN}$, the notch inductances $L_{N1}$-$L_{NN}$, the notch inductance $L_{TRACE-N}$, and the notch capacitance $C_{NOTCH}$ can be determined experimentally and/or empirically based on a target modulation of the load current $I_{LOAD}$ to ensure that the notch frequency $f_{NOTCH}$ falls within the modulation bandwidth $BW_{MOD}$ and the voltage ripple $V_{CC-RP}$ can be minimized. For example, when the modulation bandwidth $BW_{MOD}$ is 200 MHz, the RMS value of the voltage ripple $V_{CC-RP}$ can be reduced to 87 mV by setting the notch capacitance $C_{NOTCH}$ to 300 pF, the notch resistance $R_X$ (1≤X≤N) to 1Ω, and the notch inductance $L_X$ (1≤X≤N) to 4 nH.

Figure 6:
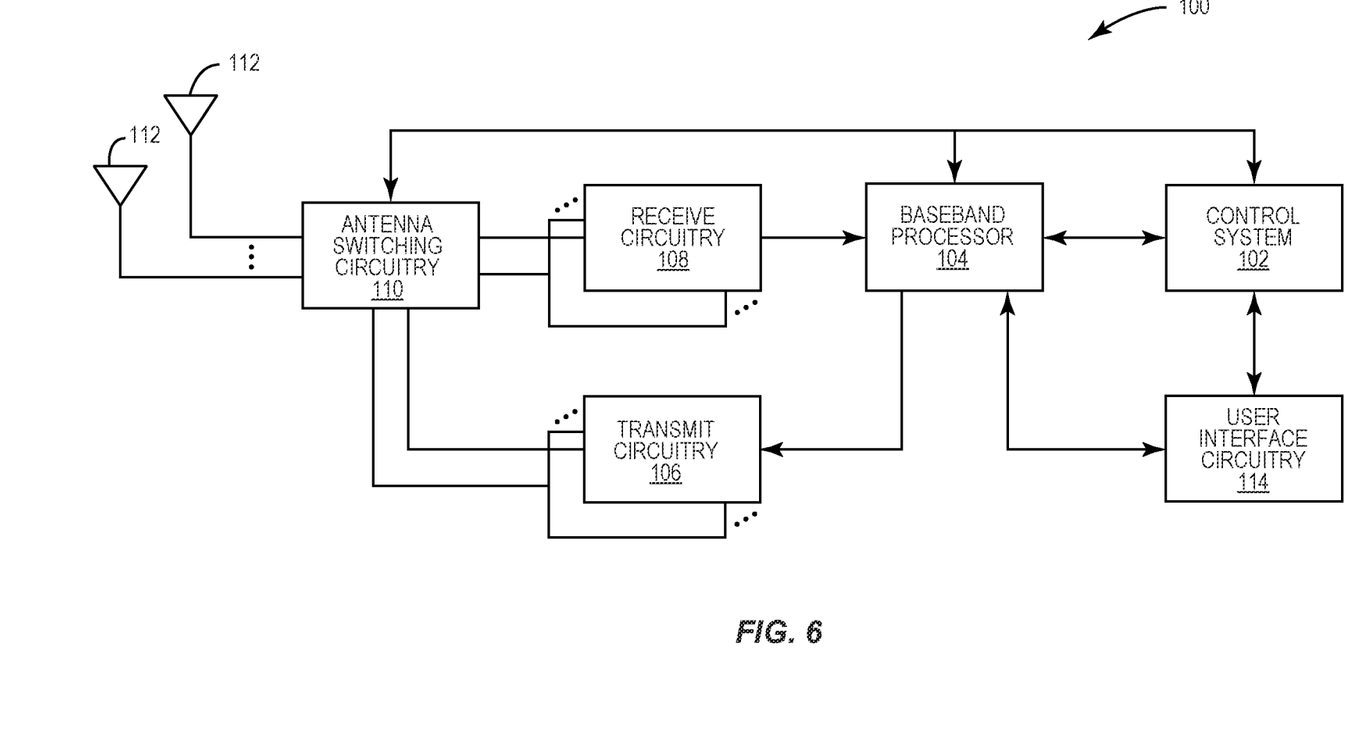
FIG. 6 is a schematic diagram of an exemplary user element wherein the power management circuits of FIGS. 2 and 4 can be provided.

The power management circuit 32 of FIG. 2 and the power management circuit 72 of FIG. 4 can be provided in a user element to enable bandwidth adaptation according to embodiments described above. In this regard, FIG. 6 is a schematic diagram of an exemplary user element 100 wherein the power management circuit 32 of FIG. 2 and the power management circuit 72 of FIG. 4 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the preferred embodiments of the present disclosure. All such improvements and modifications are considered within the scope of the concepts disclosed herein and the claims that follow.

What is claimed is:

1. A power management circuit comprising:
a power amplifier circuit configured to amplify a radio frequency (RF) signal based on a modulated voltage received at a power amplifier input, wherein the modulated voltage received at the power amplifier input comprises a voltage ripple caused by an output impedance presenting at the power amplifier input and a load current induced by the modulated voltage; and
an envelope tracking integrated circuit (ETIC) coupled to the power amplifier input via a conductive path and comprising:
a voltage modulation circuit configured to generate the modulated voltage at a voltage output based on a modulated target voltage; and
a notch circuit coupled to the power amplifier input via a notch path and configured to resonate at a notch frequency within a modulation bandwidth of the RF signal to reduce the voltage ripple to thereby achieve a defined performance threshold.

2. The power management circuit of claim 1, wherein the ETIC further comprises a control circuit configured to determine the notch frequency and cause the notch circuit to resonate at the notch frequency.

3. The power management circuit of claim 2, wherein the control circuit is further configured to determine the notch frequency based on a target modulation of the load current within the modulation bandwidth of the RF signal to thereby minimize a root-mean-square (RMS) error vector magnitude (EVM) at the target modulation.

4. The power management circuit of claim 2, wherein the control circuit is further configured to determine the notch frequency based on a target modulation of the load current within the modulation bandwidth of the RF signal to thereby minimize a peak error vector magnitude (EVM) at the target modulation.

5. The power management circuit of claim 2, wherein the control circuit is further configured to determine the notch frequency to factor in a notch inductance associated with the notch path.

6. The power management circuit of claim 2, wherein the notch circuit comprises:
a notch capacitor coupled to the power amplifier input;
a notch inductor comprising a plurality of tap points each corresponding to a respective one of a plurality of notch inductances; and
a plurality of notch switches each coupled between a respective one of the plurality of tap points and a ground.

7. The power management circuit of claim 6, wherein the control circuit is further configured to close a selected one of the plurality of notch switches to thereby cause the notch circuit to resonate at the determined notch frequency.

8. The power management circuit of claim 1, wherein the voltage modulation circuit is coupled to the power amplifier input via a feedback path and further configured to:
receive power amplifier voltage feedback indicating the voltage ripple in the modulated voltage received at the power amplifier input; and
modify the modulated voltage based on the power amplifier voltage feedback to cause a reduction in the output impedance to thereby reduce the voltage ripple in the modulated voltage received at the power amplifier input.

9. The power management circuit of claim 8, wherein the voltage modulation circuit comprises:
a voltage amplifier configured to generate an initial modulated voltage at a voltage amplifier output based on the modulated target voltage and a supply voltage; and
an offset capacitor coupled between the voltage amplifier output and the voltage output and configured to raise the initial modulated voltage by an offset voltage to thereby generate the modulated voltage at the voltage output.

10. The power management circuit of claim 9, wherein the voltage amplifier is further configured to:
receive the power amplifier voltage feedback indicating the voltage ripple at the power amplifier input; and
modify the initial modulated voltage based on the indicated voltage ripple to thereby reduce the voltage ripple in the modulated voltage.

11. The power management circuit of claim 10, wherein the voltage amplifier comprises:
an input/bias stage configured to generate a pair of bias signals based on the modulated target voltage and feedback of the modulated voltage; and
an output stage configured to generate the initial modulated voltage based on a selected one of the pair of bias signals.

12. The power management circuit of claim 11, wherein the output stage is further configured to:
receive the power amplifier voltage feedback indicating the voltage ripple at the power amplifier input; and
modify the initial modulated voltage based on the indicated voltage ripple to thereby reduce the voltage ripple in the modulated voltage.

13. The power management circuit of claim 12, wherein the output stage comprises:
a first transistor having a first drain electrode configured to receive the supply voltage, a first source electrode coupled to the voltage amplifier output, and a first gate electrode configured to receive a positive one of the pair of bias signals; and
a second transistor having a second drain electrode coupled to a ground, a second source electrode coupled to the voltage amplifier output, and a second gate electrode configured to receive a negative one of the pair of bias signals.

14. The power management circuit of claim 13, wherein the first transistor is a p-type field-effect transistor (pFET) and the second transistor is an n-type field-effect transistor (nFET).

15. The power management circuit of claim 13, wherein:
the first transistor is further configured to source a high-frequency current from the supply voltage in response to receiving the positive one of the pair of bias signals; and
the second transistor is further configured to sink the high-frequency current from the voltage output to the ground in response to receiving the negative one of the pair of bias signals.

16. The power management circuit of claim 13, wherein the output stage further comprises:
a first Miller capacitor coupled between the voltage amplifier output and the first gate electrode; and
a second Miller capacitor coupled between the voltage output and the second gate electrode.

17. The power management circuit of claim 16, wherein the first Miller capacitor and the second Miller capacitor are configured to reduce the output impedance presenting at the power amplifier input.

18. The power management circuit of claim 13, wherein the output stage further comprises:
- a first resistor-capacitor circuit coupled between the power amplifier input and the first gate electrode of the first transistor; and
- a second resistor-capacitor circuit coupled between the power amplifier input and the second gate electrode of the second transistor.

19. The power management circuit of claim 18, wherein:
the first resistor-capacitor circuit is configured to:
- receive the power amplifier voltage feedback via the feedback path; and
- modify the positive one of the pair of bias signals based on the voltage ripple indicated in the power amplifier voltage feedback; and the second resistor-capacitor circuit is configured to:
- receive the power amplifier voltage feedback via the feedback path; and
- modify the negative one of the pair of bias signals based on the voltage ripple indicated in the power amplifier voltage feedback.

20. The power management circuit of claim 19, wherein each of the first resistor-capacitor circuit and the second resistor-capacitor circuit comprises a respective adjustable capacitor and a respective adjustable resistor that can be adjusted to reduce the output impedance presenting at the power amplifier input.

* * * * *